United States Patent [19]
Gardner et al.

[11] Patent Number: 5,890,269
[45] Date of Patent: Apr. 6, 1999

[54] SEMICONDUCTOR WAFER, HANDLING APPARATUS, AND METHOD

[75] Inventors: Mark I. Gardner, Cedar Creek; Mark C. Gilmer, Austin, both of Tex.

[73] Assignee: Advanced Micro Devices, Sunnyvale, Calif.

[21] Appl. No.: 993,339

[22] Filed: Dec. 19, 1997

[51] Int. Cl.$^6$ ............................ B65G 49/07; H01L 21/68
[52] U.S. Cl. .................. 29/25.01; 148/33.2; 414/936; 118/732; 438/680; 438/758
[58] Field of Search .................. 29/25.01; 148/33.2; 414/935, 936

[56] References Cited

U.S. PATENT DOCUMENTS

4,306,731 12/1981 Shaw .
4,473,455 9/1984 Dean .
4,779,877 10/1988 Shaw .
5,046,909 9/1991 Murdoch .

*Primary Examiner*—Olik Chaudhuri
*Assistant Examiner*—William David Coleman
*Attorney, Agent, or Firm*—Joseph Van Leeuwen; Joseph Lally; Dewan & Lally, L.L.P.

[57] ABSTRACT

A semiconductor wafer comprising a single crystalline lattice suitable for use in the manufacture of integrated circuits, namely computer chips and dies, wherein a diameter of the wafer is greater than approximately 150 millimeters and wherein the wafer includes a first hole extending through the wafer. The hole is adapted to facilitate handling of the wafer without directly contacting a surface of the wafer. The wafer preferably includes a primary flat and the first hole includes a flat side having a predetermined and known orientation with respect to the primary flat of the wafer. In one embodiment, the wafer further includes a guide hole formed near the first hole such that the center-points of the first hole and the guide hole are oriented with a predetermined and known orientation with respect to the primary flat of the wafer.

21 Claims, 6 Drawing Sheets

SEMICONDUCTOR WAFER, HANDLING APPARATUS, AND METHOD

BACKGROUND OF THE INVENTION

1. Field of the Invention

This invention relates to the field of semiconductor manufacturing and more particularly, to a structure, apparatus, and method for handling semiconductor wafers in a manner which will permit transporting the wafer from one processing station to another without touching the surface of the wafer, thus reducing formation of loose particulates and permitting processing of both the top and bottom surfaces of the wafer.

2. Description of the Relevant Art

Semiconductor wafers, such as silicon wafers, are becoming increasingly large in terms of diameter. Larger diameter wafers permit placement of more devices, such as chips or dies, on the wafer thereby increasing the potential yield of the wafer. Large diameter wafers, such as those with diameters of 450 mm or greater, are increasingly difficult to handle, either manually or by robotic means. Wafers need to be physically moved to a number of processing stations for a number of various processes to be performed on the wafer. The difficulty of handling larger wafers coupled with the number of times a wafer is moved increases the risk of breakage or other damage to the wafer and its surface.

Handling of smaller diameter wafers is conventionally accomplished by using various wafer transfer mechanisms (WTMs) such as specialized tweezers for grasping the edge of the wafer and vacuum wands for applying suction to the surface of the wafer. Processing technicians use such WTMs on smaller wafers and manually move the wafers to the various processing stations. Using conventional WTMs, such as vacuum wands or tweezers, on large diameter wafers can more easily result in the wafer being damaged or broken. WTMs also tend to introduce contaminates onto the surface of the wafer as well as the dislodgment of particulates from the wafer surface. Such contamination and dislodgment can lead to failure of some of the chips or dies located on the wafer, thus lowering the yield of chips per wafer. In addition, large diameter wafers contain more chips or dies than smaller diameter wafers so that the cost of dropped or otherwise destroyed wafer due to handling is increased.

In addition, large diameter wafers are heavier than small diameter wafers. This increased weight makes it more difficult to transport the large diameter wafer using conventional WTMs and vacuum wands. Mechanical WTMs, such as tweezers, must have more force applied to prevent the wafer from dropping. This increased pressure can also contribute to damaging the chips or dies located on the wafer by introducing contaminates onto the wafer surface or dislodging particulates from the wafer surface.

In a conventional semiconductor process, integrated circuit structures, such as chips or dies, are usually only formed on one surface of the semiconductor wafer. There is increased interest, however, in processing both sides of the wafer. For example, it is sometimes necessary to remove oxide films from the backside of wafers without the surface contact of either the top or backside of the wafer. To remove oxide films that have been deposited, the front side of the wafer is conventionally pushed upward to a grounding surface, thereby endangering the already processed surface with a contacting and rubbing motion which creates particulate.

Conventional wafer processing steps are generally performed by resting the backside of the wafer on a flat support surface. In order to process the backside of the wafer, conventional means may require turning the wafer over and resting it on the front side of the wafer. This also involves resting the wafer on its front side which increases the likelihood that contaminates will be introduced to the chips or dies on the front side of the wafer. This involves increased processing steps (turning the wafer over) as well as more direct handling of the wafer. Increased direct handling adds further risk of damaging the chips or dies contained on the wafer from particulates that may become dislodged from such handling.

Chemical vapor deposition (CVD) is a processing step well known in the field of semiconductor fabrication. One problem with CVD fabrication is distributing the deposited film evenly over the wafer surface. Using conventional fabrication means, some parts of the wafer tend to receive a thicker film while other areas receive a thinner film Uneven wafer surfaces are undesirable because they tend to make subsequent processing more difficult and more prone to errors. Uneven wafer surfaces can effect photolithographic Processes and may cause notched interconnects which are susceptible to failure or reduced lifetime causing the device to fail after it has been sold to a customer. Because these types of defects may not manifest themselves until sometime well after fabrication, these types of reliability problems are very difficult to detect using conventional testing means.

Depositing films uniformly and evenly onto the surface of wafers through CVD processing is increasingly difficult on larger diameter wafers because of the inherent difficulty in maintaining a uniform deposition rate across the entire wafer. Cross-sections of wafers after CVD processing often appear wavy. As the wafer is subjected to further CVD processes, the wavy effect may become further and further pronounced. Eventually, mechanical grinding processes may need to be employed to reduce film thickness variations. Mechanical grinding processes are exceptional processes that add further risk of damage to the surface of the wafer. Not only can these processes introduce contaminates and loosen particulates on the wafer surface, but if not done properly these processes can grind into and damage the devices, such as chips and dies, which have been positioned on the wafer.

As complexity of integrated circuit devices continues to increase, circuit designers continue to add layers of circuitry to the wafers surface. Adding more layers of circuitry requires more CVD processing which can lead to undesirable effects as explained above. In addition, more overall steps and processes need to be performed to create more complex devices. As a result, more of an investment, in terms of resources and time, is made on the wafer surface. Therefore it is increasingly important to reduce the risk of contamination and formation of loose particulate as well as increase the quality of the wafer surface in terms of uniformity on larger diameter wafers.

As is described in further detail below, the prior art describes handling wafers by their edges or laying wafers flat against a platform. The prior art does not address the problem of both avoiding touching of the surface of the wafer and the need to have a handling mechanism which is independent of the wafer diameter.

Murdoch U.S. Pat. No. 5,046,909 describes a wafer holding assembly wherein a wafer is handled by a retaining ring which encircles the wafer and protruding wafer-engaging clips with ceramic tips which engage the edge of the wafer as well as a robotics system for loading a plurality of wafers into the wafer handling retaining ring. Murdoch does not, however, address the problem associated with increasing the wafer diameter without replacing or modifying the handling equipment. In addition, it is possible that holding large diameter wafers by the wafers'edges may be prone to slippage and accidental drops due to the increased size and weight of wafers roughly 450 millimeters in diameter.

Dean et all U.S. Pat. No. 4,473,455 describes a wafer holding assembly wherein a number of wafers are loaded onto a plate. Pedestal elements engage the backside surfaces of the wafers. The wafers are held in the plate by clips which are attached to springs mounted on the plate and which engage the edge of the front surface of the wafers. Dean does not, however, address the problem of touching the surface of the wafer. In Dean, wafers are rested on a pedestal from the backside of the wafer which can loosen particulates and contaminate the surface of the wafer. In addition, Dean does not address processing of the backside of the wafer.

Shaw U.S. Pat Nos. 4,306,731 and 4,779,877 describe a wafer support assembly comprising a wafer plate assembly having an aperture larger than the diameter of the wafer. Spring clips comprising spring bands or spring wires carried by the wafer plate assembly have arcuate ends which engage the wafer surfaces adjacent the edges of the wafer. Again, Shaw does not address the problem of touching the surface of the wafer which can loosen particulate and cause contamination of the wafer surface.

It would be highly desirable to provide a wafer, process, and apparatus which would be independent of the diameter of the wafer surface unlike many methods and apparatus in the prior art. In addition, it would be desirable to provide a wafer, process, and apparatus which would permit the transport of the wafer from one process station to another without directly touching the surface of the wafer. It would also be desirable to permit transport of the wafer in a manner which would allow processing of both sides of the wafer without increased contact and handling of the wafer surface.

SUMMARY OF THE INVENTION

It is, therefore, an object of the invention to provide an improved wafer, process, and apparatus for handling semiconductor wafers which permits transport of the wafer from one processing station to another without touching the wafer surface to reduce dislodgment of particulate from the wafer during such handling as well as other damage to the wafer from such direct handling.

It is another object of the invention to provide an improved wafer, process, and apparatus for processing both sides of the wafer without resting the front side of the wafer on a platform or other surface and without increased contact and handling of the wafer surface by means of a hole cut into the wafer for processing with, in one embodiment, dowel-type devices inserted through the hole. In one embodiment, the present invention contemplates use of a ceramic circlet attached to the top and bottom portions of the wafer with the hole through the circlet corresponding and passing through the hole in the wafer and the circlet providing the means of setting the wafer on a platform without the surface of the wafer touching the platform. In addition, dowel-type devices may be attached to the circlet which in turn is attached to the wafer providing an insulator from the wafer and preventing contaminates from the handling dowel to come in contact with the surface of the wafer.

It is yet another object of the invention to provide an improved wafer and a process for more uniformly disbursing gases across the surfaces of the wafer during a chemical vapor deposition process by having a vacuum pull gases across the surface of the wafer and down through the hole in the wafer or, alternatively, allowing a gas injector to inject gases through the hole in the wafer and across the surface of the wafer.

These and other objects of the invention will be apparent from the following description and accompanying illustrations.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Figure 1:
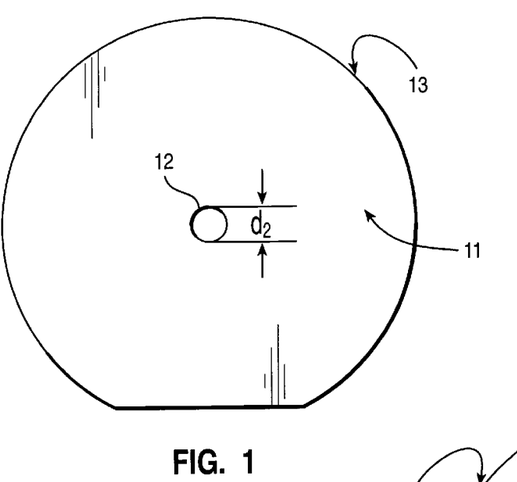
FIG. 1 is a top view of a semiconductor wafer with a round hole formed in the center of the wafer.

Referring now to FIG. 1, a semiconductor wafer 10 is shown with hole 12 formed in the center of the wafer and passing through the entire thickness of wafer 10. In a preferred embodiment, wafer 10 is a large diameter wafer (i.e., a wafer with a diameter greater than approximately 150 millimeters). The present invention contemplates a wafer handling arrangement in which a wafer is manipulated via a hole formed in the interior of the wafer so that handling defects may be reduced by eliminating direct contact with either surface 11 and 13 of wafer 10. Also shown is a primary flat portion 14 of wafer 10 used in orientation processes. Wafer 10 is preferably comprised of a single crystalline silicon structure. It is desired that hole 12 be centrally located to facilitate using wafer handling equipment which can hold several wafers simultaneously, such as a dowel-type apparatus further depicted in FIGS. 13 and 14, as well as to facilitate rotating or spinning the wafer without need to touch the surface of the wafer.

Figure 2:
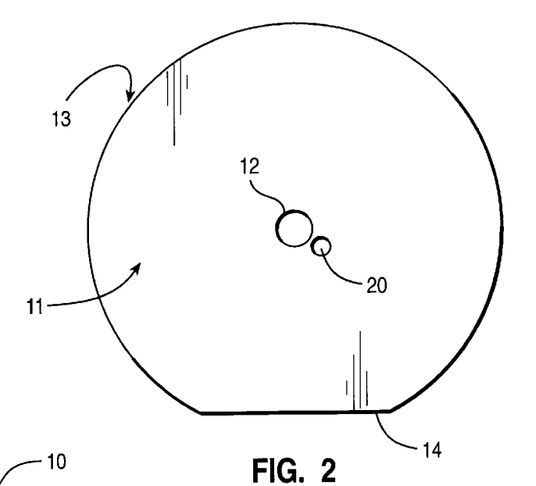
FIG. 2 is a top view of a semiconductor wafer including a round hole formed in the center of the wafer and a smaller orientation hole formed in the wafer.

Turning now to FIG. 2, which depicts an alternative embodiment of wafer 10 with hole 12. In this embodiment, a smaller guide hole, 20, has been added to wafer 10 to facilitate further handling and orientation of wafer 10. The center-point of guide hole 20 can be oriented with the center-point of hole 12 on a predetermined angle with primary flat portion 14 of the wafer 10. With a known orientation between hole 12, guide hole 20 and wafer 14, wafer processing equipment can more easily locate structures, namely chips or dies, which are formed on wafer 10. Additionally, guide hole 20 can also be used to provide a rotating force to wafer 10 rotating about hole 12 without touching either surface 11 or surface 13 of wafer 10.

Figure 3:
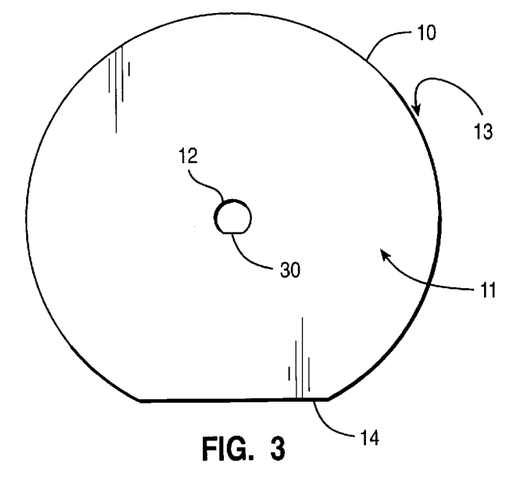
FIG. 3 is a top view of a semiconductor wafer shown with one hole cut in the center wherein the hole is flat on one side and round on the remaining sides.

Next, FIG. 3 depicts an alternative embodiment of wafer 10. In this embodiment, the hole 12 has been modified to have a flat side 30 of the hole 12. The flat side 30 is oriented with respect to the primary flat 14 of the wafer 10. This flat side 30 of the hole 12 can be used with wafer handling equipment to align the equipment with primary flat 14 of wafer 10 and locate structures, such as chips or dies, formed on wafer 10. In addition, the addition of the flat side 30 of the hole 12 facilitates rotating the wafer 10 with use of a dowel which has a corresponding flat side. This embodiment would be able to be rotated more easily than an embodiment in which a dowel is inserted in a round hole without a flat side which may tend to slip or spin when the dowel is rotated.

Figure 4:
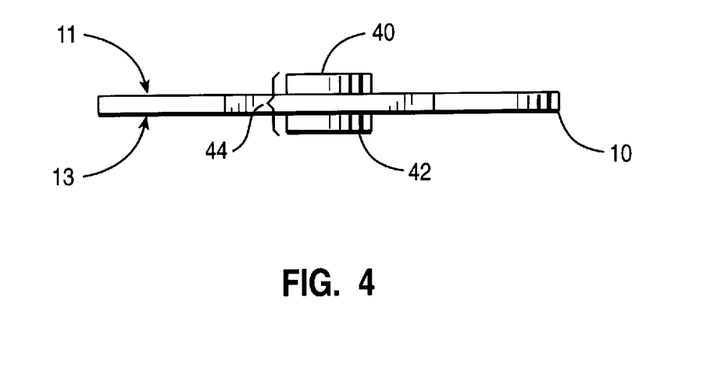
FIG. 4 is a side view showing a semiconductor wafer with a circlet attached to the wafer.

Turning now to FIG. 4, which depicts a side view of a wafer 10 with a ceramic circlet 44 composed of an upper half 40 of the circlet 44 and a lower half 42 of the circlet 44. The two circlet halves are attached by having one half, say the upper half 40, extend through hole 12 in wafer 10. The half extending through hole 12, in this case upper half 40, would have screw-type threads used to attach to corresponding screw-type threads in the lower half 42. The outside diameter of both upper half 40 and lower half 42 would be somewhat greater than the diameter of hole 12.

It is envisioned that circlet 44 will provide greater stability for manipulation of larger diameter wafers than would be provided by simply attaching dowels or other transfer mechanisms to hole 12. Manual or robotic means can securely engage with the circlet 44 without touching the surfaces 11 and 13 of wafer 10. Circlet 44 will insulate wafer 10 from changes in temperature between the dowel or other transfer mechanisms and surfaces 11 and 13 of wafer 10. It is believed that circlet 44 will keep contaminates which might be present on the surfaces of the transfer mechanism away from surfaces 11 and 13 of wafer 10 by only having transfer mechanisms touch circlet 44 rather than surfaces 11 and 13 of the wafer 10. In addition, the greater stability of the wafer with a circlet may allow multiple wafers to be handled by a single dowel so that multiple wafers may be processed simultaneously at various process stations and may also allow wafers to be stored by attaching storage means to the circlet 44 and thereby alleviating the need to rest the surface or edge of wafer 10 against any other surface or platform further reducing the chances for particulates to become dislodged from the wafer surface or having the surface contaminated by contaminates located on such surfaces and platforms.

Figure 5:
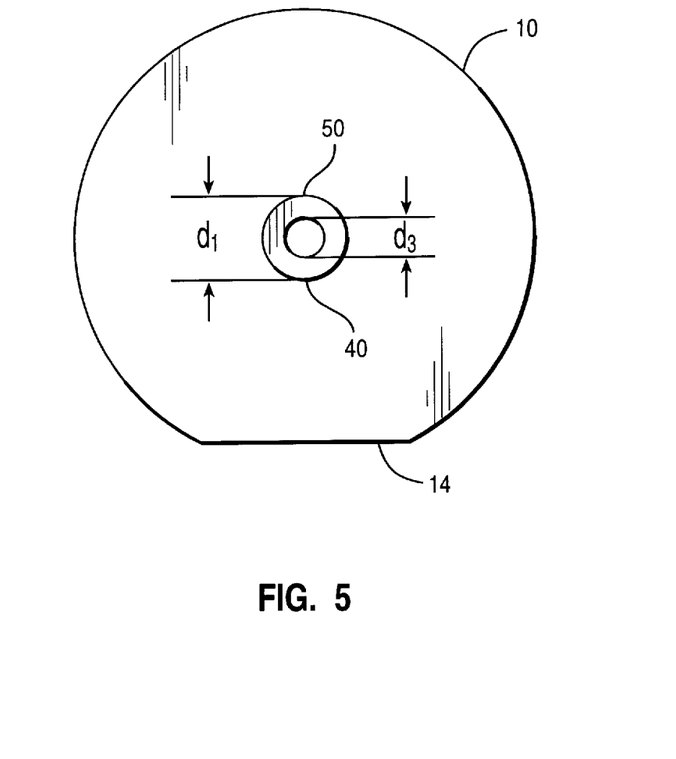
FIG. 5 is a top view showing a semiconductor wafer with a circlet attached to the wafer.

FIG. 5 shows a top view of upper half 40 of the circlet 44 attached to wafer 10. As can be further seen in this figure, the major diameter $d_1$ of upper half 40 is larger than the diameter $d_2$ of hole 12. In this embodiment, circlet 44 has a hole 50 in the center of the circlet with a diameter $d_3$ less than the diameter $d_2$ of hole 12. Circlet 44 allows wafer 10 to be further processed without having to touch the surfaces 11 and 13 of the wafer 10. Some conventional processing steps require the wafer to be set flat on the backside of the wafer. These steps can be modified by having the wafer rest upon circlet 44 thus keeping contaminates away from both surfaces 11 and 13 of wafer 10. If such processing steps apply forces to the wafer, additional stability can be provided by having a dowel or other protrusion engage with circlet hole 50 thus preventing wafer 10 from tipping or wobbling during processing.

Figure 6:
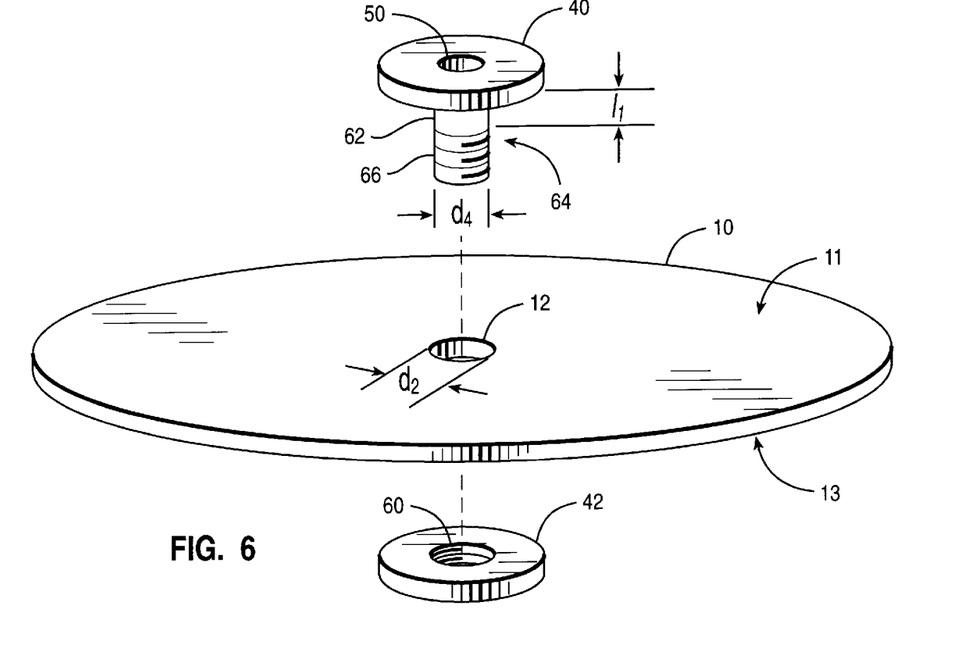
FIG. 6 is a isometric drawing showing a semiconductor wafer with an upper half on top of the wafer and a lower half below the wafer.

Turning now to FIG. 6, which shows a perspective of wafer 10 with hole 12 and an upper half 40 of circlet 44 above the wafer 10 and lower half 42 of circlet 44 below wafer 10. Lower half 42 is shown having interior screw-type threads 60 used to engage upper half 40. The upper half 40 is shown with an extension 64 used to extend through the thickness of wafer 10 and engage into the lower half 42.

Circlet hole 50 passes completely through upper half 40 including extension 64 so that when upper half 40 is engaged with lower half 42, circlet hole 50 passes through upper half 40, wafer 10, and lower half 42.

Extension 64 is further comprised of screw-type threads 66 and a spacer 62. In one embodiment, extension 64 is designed to loosely engage with hole 12. The ceramic components of circlet 44 differ from the composition of wafer 10 so the materials selected to be used should be tested to determine the exact parameters of the space between the extension 64 and the hole 12 in the wafer 10. In a presently preferred embodiment, circlet 44 comprises fused quartz. It will be appreciated that spacer 62 is shown as smooth (not threaded) but can have threads in alternative embodiments.

As the ceramic materials of circlet 44 have different physical properties to those of wafer 10, such as a rate of contraction and expansion when exposed to temperature changes at various processing stations, it is desirable that circlet 44 be loosely engaged with wafer 10. To accomplish this, outer diameter $d_4$ of extension 64 is slightly smaller than diameter $d_2$ of hole 12 in wafer 10. In addition, length $l_1$ of spacer 62 is slightly longer than depth $l_2$ of wafer 10 preventing upper half 40 from being too tightly screwed into lower half 42 which would otherwise allow circlet 44 to be tightly engaged with wafer 12.

Figure 7:
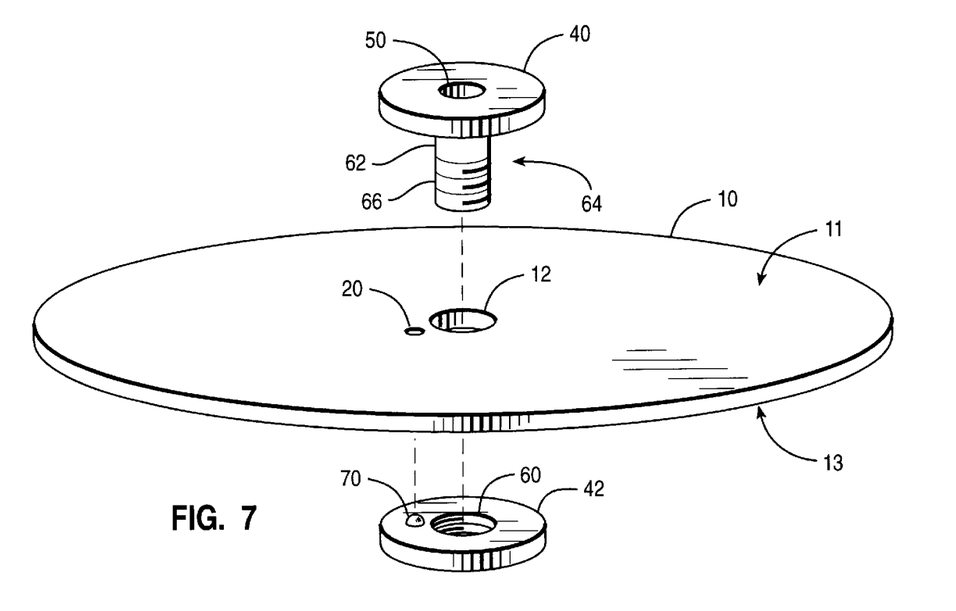
FIG. 7 is an isometric drawing showing a semiconductor wafer with an upper half above the wafer, a guide hole in the wafer, and a guide pin in the lower half for engaging with the guide hole.

FIG. 7 shows an alternative embodiment of attaching circlet 44 with wafer 10 and also using a guide hole 20 in wafer 10. This embodiment shows a pin 70 protruding from the surface of lower half 42. Pin 70 is designed to be inserted into guide hole 20 to prevent circlet 44 from slipping or rotating about hole 12 in wafer 10. Once circlet 44 is engaged with wafer 10 mechanical and robotic means can be used to manipulate wafer 10 by simply engaging with circlet 44.

Figure 8:
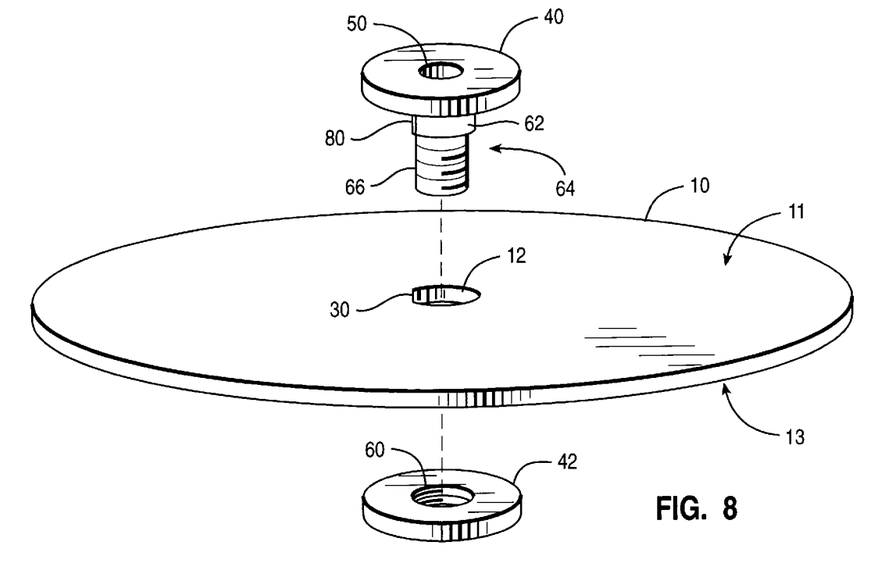
FIG. 8 is an isometric drawing showing a semiconductor wafer with an upper half above the wafer with a flat side on the extension protruding from the top of the upper half, a flat side on the hole in the wafer, and a lower half which will engage with the threads from the extension protruding from the upper half.

FIG. 8 shows another alternative embodiment of attaching circlet 44 with wafer 10. In this embodiment, hole 12 has a flat side 30 as previously depicted in FIG. 3. Spacer 62 of extension 64 has a flat side 80 corresponding with flat side 30 of hole 12. Spacer flat side 80 is designed to engage with flat side 30 of hole 12 so that rotation of circlet 44 also causes wafer 10 to rotate.

Figure 9:
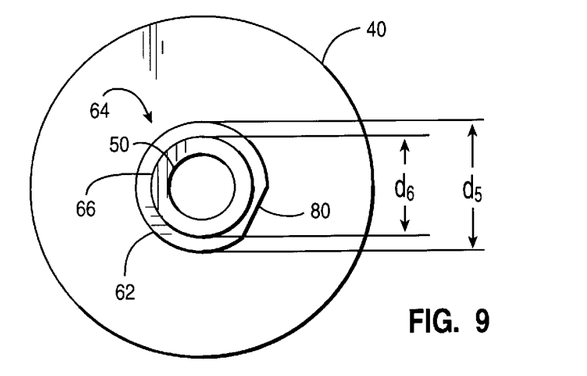
FIG. 9 is a bottom view of the upper half depicting a flat side on part of the extension.

FIG. 9 is a bottom-view of upper half 40 and extension 64 which more clearly shows spacer flat side 80. As seen in the figure, hole 50 goes through extension 64 and upper half 40. When extension 64 is engaged with the lower half 42 (not shown in this figure) hole 50 would extend from the top of upper half 40 and pass through the bottom of lower half 42. In this manner, hole 50 would allow a vacuum or blower to be attached to wafer 10 with attached circlet 44. By having a hole pass through the center of the wafer 10, it is envisioned that the uniformity of certain processes, such as CVD, will be improved improved by providing a method of more uniformly distributing the reaction mixture across the surface of wafer 10.

Referring back to FIG. 8, the threaded portion 66 of extension 64 engages with corresponding threads in the lower half 42. By engaging threaded portion 66 of upper half 40 with threads 60 in lower half 42 and having flat portion 80 of hole 50 in the spacer 62 portion of extension 64, wafer 10 and circlet 44 will form a unit which can be manipulated by manual or robotic means by further engaging with circlet 44 without touching the surfaces 11 and 13 of the wafer 10.

It will be appreciated by those skilled in the art that other attachment means other than screw-type threads may be used to attach the upper half 40 with the lower half 42. For example, the upper and lower halfs could be fused or otherwise permanently joined to prevent the removal of the circlet 44. In addition, other attachment means, such as mechanical locks or clips, could possibly be used in joining the two halves of the circlet. The threaded portion 66 of the extension 64 is cylindrical with an interior diameter equal to the diameter of the hole 50 passing through it and an external diameter equal to the diameter of the threaded portion 66 which is roughly equal to the hole with corresponding threads 60 located in the lower half 42 (not shown in this figure). The external diameter of the threaded portion 66 of the extension 64 is also somewhat smaller than the hole 12 passing through the wafer 10 and is also somewhat smaller than the spacer portion 62 of the extension 64.

In the presently preferred embodiment, the spacer portion 62 of extension 64 engages with hole 12 in wafer 10. The spacer portion 62 preferably has one flat side 80 which corresponds to a flat side 30 of the hole 12 (FIG. 3 shows an example of wafer 10 a flat side 30 located on the hole 12). The outside diameter $d_5$ of spacer 62 is slightly greater than the diameter $d_6$ of threaded portion 66. Again, spacer 62 is shown as cylindrical in shape with the outside diameter $d_5$ being slightly larger than diameter $d_3$ of hole 50 passing through spacer 62. It will be appreciated by those skilled in the art that the shape of spacer 62 simply must coincide with the shape of the hole 12 in the wafer 10.

Flat side 80 of spacer 62 corresponds with a flat side 30 of hole 12. Flat side 80 needs to cover a sufficient portion of the circumference of spacer 62 so that it will prevent circlet 44 from slipping from wafer 10 when circlet 44 has been engaged with wafer 10. It will be appreciated by those skilled in the art that a cylindrical shaped spacer 62, extension 64, and threaded portion 66 is only one embodiment that could exist. For example, the spacer 62 could be square shaped with a corresponding square hole in the wafer 10 rather than a round hole 12. Furthermore, the shape of circlet 44 itself need not be cylindrical in shape. A square or non circular shape may be used in place of the cylindrical shape disclosed herein.

Figure 10:
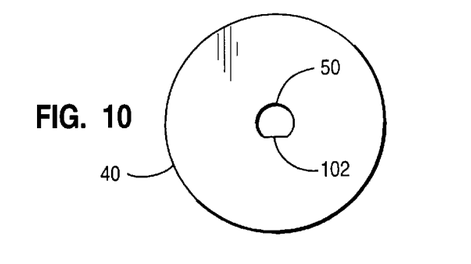
FIG. 10 is a top view of an alternative embodiment of the upper half with a hole passing through the upper half wherein the hole includes a flat side for positive engagement with wafer transfer devices.

FIG. 10 depicts a top view of an alternative embodiment of the upper half 40. In this embodiment, hole 50 through the circlet 44 includes a flat side 102. This embodiment would allow a dowel with a corresponding flat side to be inserted through hole 50 in order to better control the rotation and manipulation of circlet 44. When combined with other embodiments, such as the pin 70 inserted in the guide hole 20 as depicted in FIG. 7 or the flat side 80 of the spacer 62 designed to engage with a flat side 30 of the hole 12 as depicted in FIG. 8 and 9, the circlet flat side 102 provides for a greater ability to orient and position wafer 10 so that primary flat 14 is in a known position and thereby facilitating the location of structures, such as chips or dies, located on the surfaces 11 and 13 of wafer 10.

Figure 11:
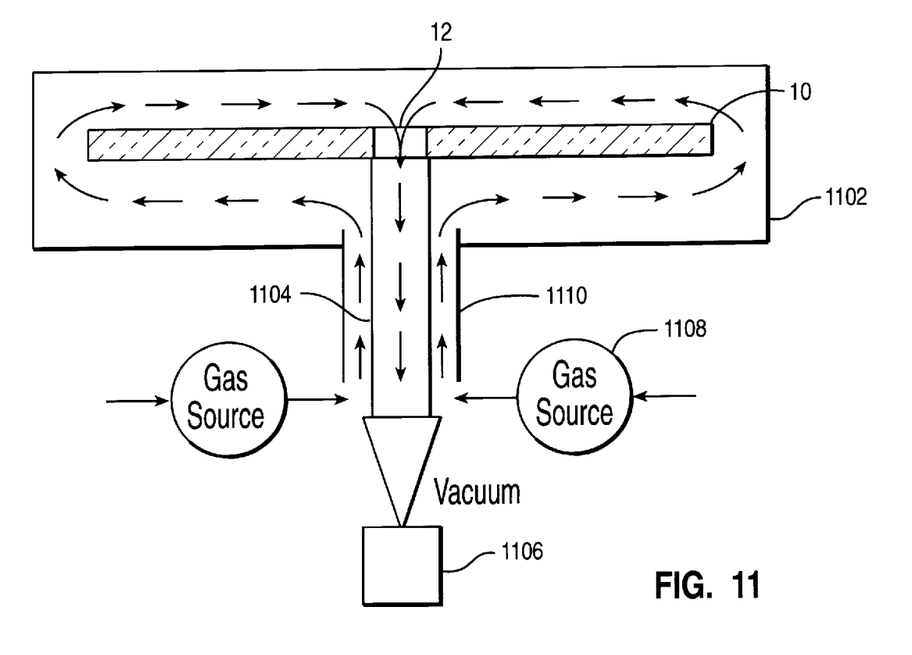
FIG. 11 is a side view of a semiconductor wafer shown with a hole formed in the center undergoing chemical vapor deposition (CVD)

Turning now to FIG. 11, a wafer 10 is depicted undergoing chemical vapor deposition (CVD) in a CVD reactor chamber 1102. A vacuum extension 1104 is inserted into hole 12 in wafer 10 and attached to a vacuum source 1106. A gas source 1108 supplies gas used in the chemical vapor deposition through gas supply line 1110 into reactor chamber 1102. Vacuum source 1106 is used to pull the gas from the reactor chamber down through hole 12 in wafer 10. It is envisioned that forcing gas across the backside of the wafer and then across the top surface of the wafer 10 to the hole 12 in the center of wafer 10 will result in more uniform deposition rates across the surfaces 11 and 13 of wafer 10.

As will be appreciated by those skilled in the art, the CVD process described in FIG. 11 will work for wafer 10 with hole 12 or with a wafer 10 with an attached circlet 44 (See FIG. 8-9 depicting a circlet 44 with a hole 50 through the circlet 44) so long as circlet hole 50 in the circlet 44 passes from the top of wafer 10 and extends through the bottom of wafer 10. It is further envisioned that processes using hole 12 in wafer 10 will be able to better process multiple wafers simultaneously. Having a hole 12 in the center of the wafer 10 will facilitate better ventilation about the top and bottom surfaces of the wafer 10. In addition, the ability to control the movement of wafer 10 by rotating an attached circlet 44 is likely to lead to further improvements in processing such semiconductor wafers.

Figure 12:
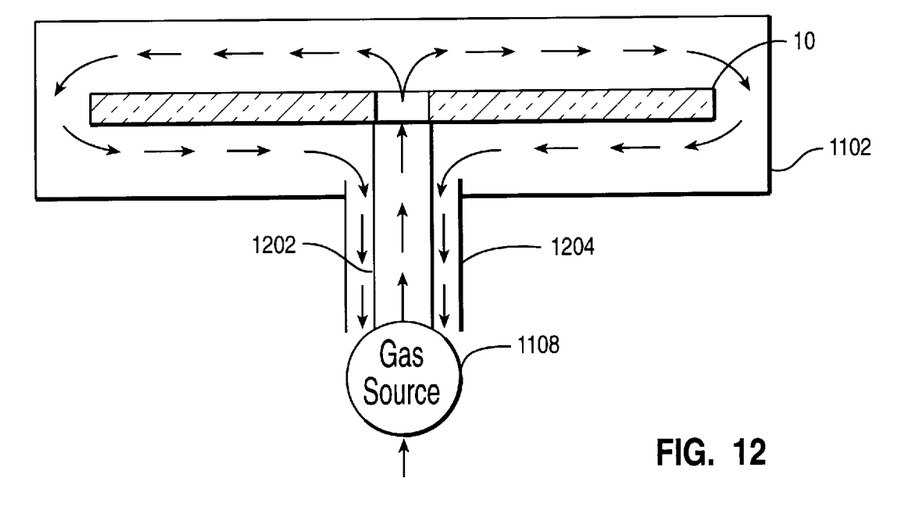
FIG. 12 is a side view of a semiconductor wafer shown with a hole formed in the center undergoing chemical vapor deposition (CVD)

Another embodiment of a modified CVD reactor chamber is shown in FIG. 12. In this figure, a gas source 1108 is used to push gas up through a gas source extension tube 1202 which has been inserted in hole 12 in wafer 10. The gas is forced up through the hole 12 in wafer 10 into the reactor chamber 1102. The gas then passes across the top surface 11 of the wafer 10, around and across the backside surface 13 of wafer 10 and finally out through gas exhaust line 1204. To increase the rate at which gas travels across the surfaces 11 and 13 of wafer 10, a vacuum source (such as the one depicted in FIG. 11) could be attached to the ends of the gas exhaust line 1204. In this process, wafer 10 could also be attached to circlet 44 with circlet hole 50 being attached to gas source extension tube 1202 instead of having the gas source extension tube attach directly to hole 12 in the wafer 10.

CVD reaction chamber 1102 is typically heated to high temperatures in performing the CVD process. Materials comprising circlet 44 must be able to withstand these temperatures. One possible embodiment is to use a ceramic material such as fused quartz to make circlet 44. It will be appreciated by those skilled in the art that other materials, for example carbon based materials, may be used as an alternative to ceramic material in creating the circlet 44 and its components (see FIG. 6 for example components). It is also known by those skilled in the art that certain materials, namely metals, are typically not desired for CVD processes due to the effect they can have on materials comprising a semiconductor wafer 10. In addition, those skilled in the art will appreciate that under high temperatures with a CVD reaction chamber 1102 some expansion of materials present in the reaction chamber can occur. Therefore, it is important that the physical properties of wafer 10 and circlet 44 be established for tolerances and expansion under CVD conditions.

Figure 13:
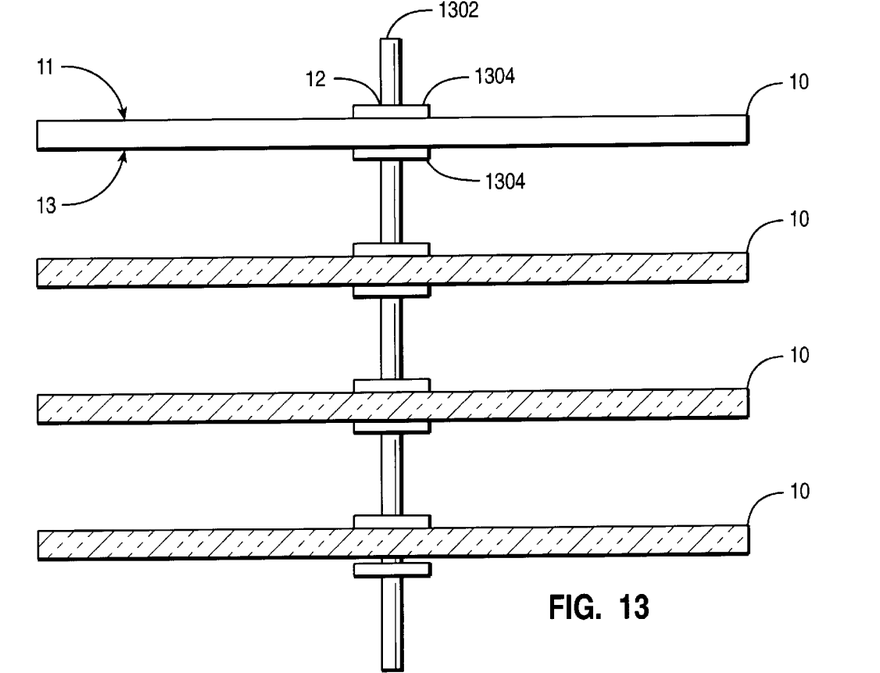
FIG. 13 is a side view of multiple semiconductor wafers attached to a dowel-type device for handling wafers as a group.

Turning now to FIG. 13, which depicts multiple wafers 10 being simultaneously engaged with a dowel-type handling mechanism 1302. In this embodiment, the dowel-type handling mechanism 1302 extends through holes 12 in wafers 10. Dowel collars 1304 would need to be attached to the dowel-type handling mechanism 1302 to keep the surfaces 11 and 13 of the wafers 10 from touching each other. It will be appreciated by those skilled in the art that a variety of embodiments for dowel collars 1304 exist. Dowel collars 1304 could be attached to the dowel-type handling mechanism 1302 by screws or could be spring loaded so that the dowel collar 1304 recesses into dowel-type handling mechanism 1302 to allow wafer 10 to be engaged with and removed from dowel-type handling mechanism 1302 by manual or robotic means.

Figure 14:
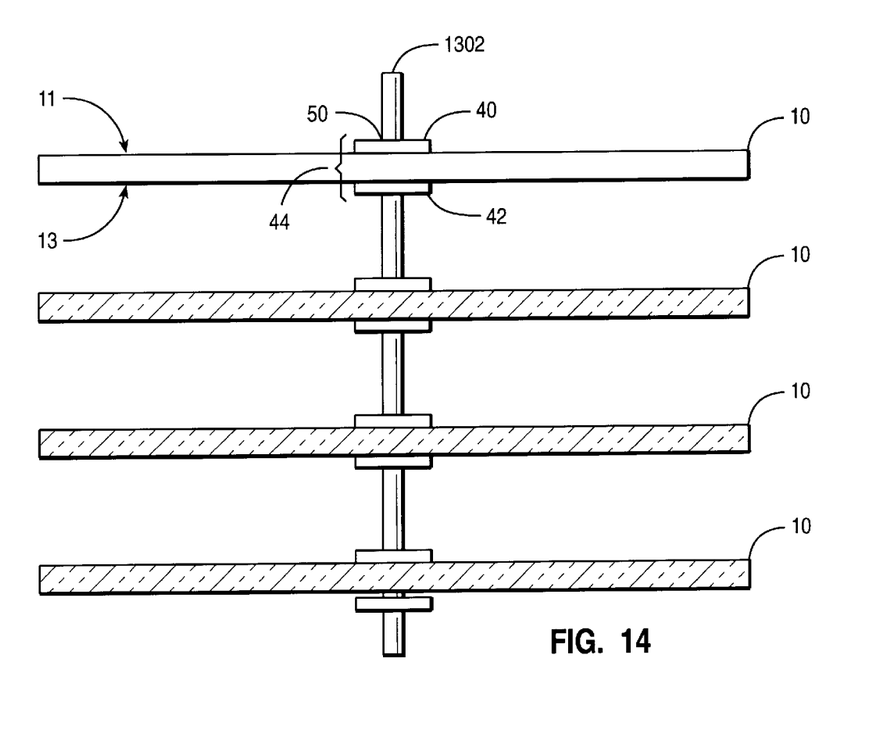
FIG. 14 is a side view of multiple semiconductor wafers each with a circlet attached and with a dowel-type device attached to the circlets for handling wafers as a group.

Turning now to FIG. 14, which depicts an alternative embodiment for engaging multiple wafers 10 with a dowel-type handling mechanism 1302. In this embodiment, circlets 44 are engaged with wafers 10 and then dowel-type handling mechanism 1302 is inserted through the circlet holes 50. Referring back to FIG. 13, dowel collars are needed to keep the circlets 44 secured to the dowel-type handling mechanism 1302.

FIGS. 13 and 14 depict how wafers 10 can be handled without touching the surfaces 11 and 13 of the wafers 10. Dowel-type handling mechanisms 1302 can be inserted through circlet holes 50 in wafers 10 with circlets 44 or through holes 12 in wafers 10 without circlets 44 attached. Wafers 10 can be stored and handled without touching the surfaces 11 and 13 of the wafer 10 and regardless of the diameter $d_7$ of the wafer 10. As the backside surface 13 of wafer 10 is not rested against a platform or other surface, it can be processed along with the front side surface 11 of wafer 10.

Backside surface 13 can be processed to remove oxide films that have been deposited on the backside surface 13 of wafer 10. Another possible use of processing the backside surface 13 of wafers 10 would be to add circuitry to the backside surface 13 of wafers 10. Such circuitry could be contained to separate chips or dies located on the backside surface 13 of wafer 10 and subsequently wafer 10 could be sliced to separate the devices formed on the front side surface 11 from the devices formed on the backside surface 13 of the wafer 10. Such circuitry formed on the backside surface 13 could also be integrated with the circuitry formed on the front side surface 11 of the wafer to facilitate greater density in chip design without adding more circuitry layers to the front side surface 11 of the wafer 10.

It will be apparent to those skilled in the art having the benefit of this disclosure that the present invention contemplates an improved semiconductor wafer with a hole at the center of the wafer and apparatus for handling a semiconductor wafer and an improved method for processing semiconductor wafers. It is understood that the form of the invention shown and described in the detailed description and the drawings are to be taken merely as presently preferred examples of a semiconductor wafer can be improved and handled without touching the surface of the wafer and how chemical vapor depositions can be applied to the improved wafer. It is intended that the following claims be interpreted broadly to embrace all the variations of the preferred embodiments disclosed.

What is claimed:

1. Apparatus for handling a semiconductor wafer, said wafer comprising a single crystalline lattice wherein the wafer includes a first hole extending through the wafer said apparatus comprising a circlet adapted to attach to the center of the wafer, said circlet comprising an upper half and a lower half wherein an extension of the upper half of the circlet is configured to pass through the first hole of the wafer and connect to the lower half of the circlet, one half on each side of the wafer, and wherein the circlet is adapted to receiving handling means which manipulate the wafer by attaching to the circlet without touching the surface of the wafer.

2. The apparatus of claim 1 wherein said upper half is engaged with said lower half by screw-type threads on said upper half corresponding to screw-type threads on said lower half.

3. The apparatus of claim 1 wherein said circlet further comprises:
   cylindrical extension extending from the upper half wherein an outside diameter of said cylindrical extension is less than a diameter of said first hole in said wafer;
   screw-type threads on the outside surface of the extension;
   a second hole extending through the lower circlet, wherein a diameter of said second hole is greater than the diameter of said extension; and
   screw-type threads on the surface of the second wherein an angle and size of said threads on the surface of the hole is adapted for receiving the threads on the extension from the upper half.

4. The apparatus of claim 1 wherein said circlet includes a hole passing through the circlet, wherein said hole is adapted to receive a dowel or other wafer handling means inserted through the hole in the circlet for manipulating the wafer attached to the circlet without touching the surface of the wafer.

5. The apparatus of claim 4 wherein the hole extending through the circlet comprises a rounded hole including a flat side, so that dowels or other wafer handling means adapted for fitting the hole are inserted in the hole in the circlet and positively engage the hole without slipping so that one rotation of the dowel or other wafer handling means results in a corresponding rotation of the semiconductor wafer.

6. The apparatus of claim 1 wherein the circlet is comprised of a material adapted to withstand high temperatures without cracking, melting or breaking.

7. The apparatus of claim 1 wherein the extension is further comprised of two parts, namely a threaded portion and a spacer portion, wherein the spacer portion is substantially round and includes one flat side adapted to engage with a flat side of the hole extending through the hole in the wafer to prevent the wafer from spinning or shifting position when the circlet is rotated.

8. The apparatus of claim 7 wherein the flat side on the spacer portion of the extension is at a known orientation with respect to the primary flat of the wafer.

9. The apparatus of claim 1 wherein the circlet is further configured to be engaged with the wafer by a pin extending from the surface of the lower circlet wherein the length of the pin is less than or equal to the depth of the wafer and wherein the pin is adapted for engaging with a guide hole formed into the surface of the wafer near the first hole to prevent the wafer from spinning or shifting position when the circlet is rotated.

10. The apparatus of claim 9 wherein the center-points of the guide hole and the first hole are at a known orientation with respect to the primary flat of the wafer.

11. The apparatus of claim 1 wherein said circlet has an interior diameter and an exterior diameter, and wherein the interior diameter is less than or equal to the diameter of the first hole and further wherein the exterior diameter is larger than the first hole diameter whereby circlet overlaps the edges of the hole in the center of the wafer when the circlet is centered and placed upon the wafer.

12. The apparatus of claim 1 wherein the circlet includes a circlet hole, wherein said circlet hole passes through the circlet and the extension of the circlet so that when the circlet is engaged with the wafer and the wafer is between the upper and lower halves of the circlet said circlet hole passes through from the top of the upper circlet, through the wafer, and passes through the lower half of the circlet.

13. The apparatus of claim 12 wherein said circlet hole includes a flat.

14. The apparatus of claim 1 wherein said circlet is a ceramic material, silicon carbide, or another non-contaminating material adapted to withstand high temperatures.

15. In a semiconductor fabrication facility, a method of reducing contact with a surface of a semiconductor wafer, said method comprising handling said wafer with a wafer transfer mechanism, wherein said wafer includes a first hole, and further wherein said wafer transfer mechanism utilizes said hole in said wafer to handle said wafer without touching a surface of said wafer.

16. The method of claim 15, wherein said wafer transfer mechanism comprises a dowel, said dowel adapted to extend through said first hole to engage said wafer without touching a surface of said wafer.

17. The method of claim 15 wherein an apparatus attached to the hole in the wafer comprises a circlet with two halves and an extension passing through the hole in the wafer and a hole passing through the circlet and connecting the two halves is used to manipulate the wafer by attaching dowels or other wafer transfer mechanisms to the hole in the circlet without touching the surface of the wafer.

18. The method of claim 15 which further comprises attaching the circlet to the wafer and attaching the dowel shaped tube to the hole in the circlet so that gases are injected into the CVD reaction chamber by way of the hole in the circlet attached to the tube which in turn is attached to the gas source.

19. The method of claim 15 which further comprises said wafer transfer mechanism being a dowel shaped cylinder with an interior diameter and an exterior diameter and used to transport vapors through the hole in the wafer during a chemical vapor deposition (CVD) process.

20. The method of claim 19 which further comprises attaching the circlet to the wafer and attaching the dowel to the hole in the circlet so that vapors are transported through the hole in the circlet.

21. The method of claim 15 wherein said wafer transfer mechanism is used engaged with said holes in a plurality of said wafers so that said plurality of wafers can be handled, stored or processed as a group.

* * * * *